United States Patent
Sakio et al.

(10) Patent No.: US 10,927,443 B2
(45) Date of Patent: Feb. 23, 2021

(54) VAPOR DEPOSITION MASK, METHOD FOR MANUFACTURING VAPOR DEPOSITION MASK, VAPOR DEPOSITION METHOD, AND METHOD FOR MANUFACTURING ORGANIC EL DISPLAY DEVICE

(71) Applicant: HON HAI PRECISION INDUSTRY CO., LTD., New Taipei (TW)

(72) Inventors: Susumu Sakio, Osaka (JP); Koshi Nishida, Osaka (JP); Katsuhiko Kishimoto, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 91 days.

(21) Appl. No.: 16/089,392

(22) PCT Filed: Jul. 27, 2016

(86) PCT No.: PCT/JP2016/072069
§ 371 (c)(1),
(2) Date: Sep. 28, 2018

(87) PCT Pub. No.: WO2017/168773
PCT Pub. Date: Oct. 5, 2017

(65) Prior Publication Data
US 2019/0106781 A1 Apr. 11, 2019

(30) Foreign Application Priority Data
Mar. 29, 2016 (JP) .............................. JP2016-066804

(51) Int. Cl.
*H01L 21/00* (2006.01)
*C23C 14/04* (2006.01)
(Continued)

(52) U.S. Cl.
CPC ............ *C23C 14/042* (2013.01); *C23C 14/24* (2013.01); *H01L 51/0011* (2013.01); *H01L 51/56* (2013.01)

(58) Field of Classification Search
CPC ... C23C 14/042; C23C 14/24; H01L 51/0011; H01L 51/56
See application file for complete search history.

(56) References Cited

U.S. PATENT DOCUMENTS

| 2015/0037928 A1 | 2/2015 | Hirobe et al. |
| 2015/0259780 A1 | 9/2015 | Mizumura |
| 2018/0171470 A1 | 6/2018 | Takeda et al. |

FOREIGN PATENT DOCUMENTS

| JP | 2013-163864 A | 8/2013 |
| JP | 2013-245392 A | 12/2013 |

(Continued)

OTHER PUBLICATIONS

Machine Translation of JP2015-092016, 2020.*

*Primary Examiner* — Richard A Booth
(74) *Attorney, Agent, or Firm* — ScienBiziP, P.C.

(57) ABSTRACT

A deposition mask, which are capable of enhancing close contact between a substrate for vapor deposition and a peripheral region of each opening in the deposition mask during vapor deposition, suppressing the occurrences of film blurs and shadows during vapor deposition, and performing high definition patterning, a method for manufacturing the same, and a vapor deposition method using the deposition mask, are provided. A deposition mask (1) comprises a resin film (11) having a pattern of openings (12) for forming a thin layer pattern by vapor deposition on a substrate for vapor deposition (2). The deposition mask (1) includes a magnetic metal layer (13*a*) provided on at least a peripheral portion of each opening (12) of a surface of the resin film (11) to be brought into contact with the substrate for vapor deposition (Continued)

(2), thereby enhancing close contact between the substrate for vapor deposition (2) and the peripheral region of each opening (12) of the deposition mask (1) during vapor deposition, and suppressing the occurrences of film blurs and shadows during vapor deposition.

12 Claims, 3 Drawing Sheets

(51) Int. Cl.
  *C23C 14/24* (2006.01)
  *H01L 51/00* (2006.01)
  *H01L 51/56* (2006.01)

(56) References Cited

FOREIGN PATENT DOCUMENTS

| | | |
|---|---|---|
| JP | 2014-201819 A | 10/2014 |
| JP | 2014-218735 A | 11/2014 |
| JP | 2015-092016 A | 5/2015 |

* cited by examiner

VAPOR DEPOSITION MASK, METHOD FOR MANUFACTURING VAPOR DEPOSITION MASK, VAPOR DEPOSITION METHOD, AND METHOD FOR MANUFACTURING ORGANIC EL DISPLAY DEVICE

TECHNICAL FIELD

The present invention relates to a deposition mask which is employable in depositing an organic layer of an organic EL display apparatus, a method for manufacturing a deposition mask, a vapor deposition method, and a method for manufacturing an organic EL display apparatus. More specifically, the present invention relates to a deposition mask which can suppress the occurrences of film blurs and shadows during vapor deposition by improving close contact with a substrate for vapor deposition, a method for manufacturing a deposition mask, a vapor deposition method, and a method for manufacturing an organic EL display apparatus using the deposition mask.

BACKGROUND ART

When an organic EL display apparatus is manufactured, for example, an organic layer is deposited at places corresponding to respective pixels on an apparatus substrate wherein switching elements such as TFTs are formed on a support substrate. Therefore, a deposition mask is mounted on the apparatus substrate and thereafter an organic material is disposed on the substrate via the deposition mask, resulting that a required organic layer can be deposited for only required pixels. A metal mask has been conventionally used as the deposition mask. However, in order to form much fine pattern of mask openings, a recent trend is that resin films are used as mask material instead of the metal masks. In this case, for the purpose of reinforcement, a composite deposition mask including a metal support layer laminated on a resin film can be also used. The metal support layer has openings or slits slightly larger than the openings of the resin film so as to prevent the occurrence of shadows during vapor deposition (for example, see Patent Document 1).

During vapor deposition, for example, since a vapor deposition material such as an organic material scattered from a vapor deposition source is deposited to a substrate for vapor deposition through openings of the deposition mask, the deposition mask is placed on the substrate for vapor deposition so that the resin film surface of the vapor deposition mask is directed to the substrate is placed so as to face the substrate for vapor deposition. Fixation of the deposition mask in this case is performed by using magnetic force of a magnet arranged at the substrate for vapor deposition opposite from the deposition mask so as to attract a metal frame provided around the deposition mask or the metal support layer having the opening slightly greater than the openings of the resin film through the substrate for vapor deposition and the resin film.

On the other hand, in Patent Document 2, in order to facilitate the manufacturing of such a composite deposition mask, it is disclosed that magnetic metal powders are dispersed in a binder and laminated as a magnetic layer on a base film and an openings are formed also in this magnetic layer together with the base film by irradiation of laser beam.

PRIOR ART DOCUMENT

Patent Document

Patent Document 1: JP 2013-163864 A
Patent Document 2: JP 2014-201819 A

SUMMARY OF THE INVENTION

Problem to be Solved by the Invention

In the case of using the composite deposition mask discussed in Patent Document 1, at the time of vapor deposition, for example, as illustrated in FIG. 4, magnetic force of a magnet 3 arranged at a substrate for vapor deposition 2 opposite from the deposition mask 1 attracts a metal support layer 14 having openings 14a slightly greater than each opening 12 in the resin film 11 to fix a deposition mask 1. On the other hand, the magnetic force does not directly act on the resin film 11.

In other words, even when the composite deposition mask 1 is used, no magnetic substance is present at a place where the metal support layer 14 is not formed at the peripheral portion of each opening 12 of the deposition mask 1 and such portions are not sufficiently attracted by a magnetic chuck. As illustrated exaggeratedly in FIG. 4, a gap G easily occurs between the resin film 11 and the substrate for vapor deposition 2. As a result, film blurs or uneven pattern occurs when a vapor deposition material 5 is deposited, and display quality is deteriorated when it is formed into an organic EL display apparatus.

On the other hand, as discussed in Patent Document 2, when providing a magnetic layer including magnetic metal powders contained in a resin, in order to cause particles of the employed magnetic metal powders to disperse at a sufficient concentration without causing any separation, it is considered that the thickness of the magnetic layer becomes larger and accuracy deterioration of a vapor deposition pattern caused the magnetic layer tends to occur. That is, although formation of the openings in the magnetic layer is performed by laser beam irradiation, it is considered that the metal powders are hardly processed by a laser beam and are easily desorbed. Accordingly, it is considered that the openings becomes uneven and therefore forming a precise pattern of openings is difficult. Further, since metal powders do not adhere to each other, it is considered that the magnetic metal powders are required to disperse so that a binder intervenes between the powders. However, when the amount of the magnetic metal powders is small, the magnetic metal powders may not sufficiently function as the magnetic substance and accordingly may not sufficiently function as the magnetic chuck. Therefore, it is difficult to assure sufficient concentration of the magnetic metal powders while maintaining adhesion to the resin film. If the adhesion is prioritized, sufficient attraction force will not be obtained. On the other hand, if the attraction force is prioritized, the magnetic layer will easily flake off from the resin film. Further, it is considered that there is a problem that a precise pattern of openings cannot be formed due to desorption of the magnetic metal powders having a higher concentration.

Accordingly, the present invention has been made to solve the above-mentioned problems and intends to provide a deposition mask including a resin film which can enhance close contact between a substrate for vapor deposition and a resin mask during vapor deposition and can suppress the occurrences of film blurs and shadows, without affecting on the accuracy of a pattern of openings of the deposition mask and a method for manufacturing the same.

Another object of the present invention is to provide a vapor deposition method capable of forming a high definition vapor deposition pattern by using the above-mentioned deposition mask.

Still another object of the present invention is to provide a method for manufacturing an organic EL display apparatus capable of realizing excellent display quality by using the above-mentioned deposition mask.

Means to Solve the Problem

The inventors of the present invention conducted diligent studies to obtain a deposition mask capable of suppressing the occurrences of film blurs and shadows during vapor deposition. As a result, the inventors have found that by providing a magnetic metal layer reaching the edge of each opening on a surface of a resin film of a deposition mask to be brought into contact with a substrate for vapor deposition it is possible to enhance close contact between the resin film and the substrate for vapor deposition during vapor deposition and suppress the occurrences of film blurs and shadows. That is, for example, by forming the magnetic metal layer by sputtering or the like after completing formation of the openings in the resin film of the deposition mask it is possible to constitute the magnetic metal layer so as to reach the edge of each opening and so as to be very thin enough to avoid an adverse influence such as shadows during vapor deposition. The formation of the magnetic metal layer is particularly effective when provided in the vicinity of each opening, and it is sufficient if the magnetic metal layer is provided on at least the peripheral portion of each opening in the resin film.

A deposition mask according to the present invention is a mask comprising a resin film having a pattern of openings for forming a thin layer pattern by vapor deposition on a substrate for vapor deposition, and is characterized in that a magnetic metal layer is provided on at least the peripheral portion of each opening of a surface of the resin film to be brought into contact with the substrate for vapor deposition.

A method for manufacturing a deposition mask according to the present invention is a method for manufacturing a deposition mask comprising a resin film having a pattern of openings and usable in vapor depositing a vapor deposition material on a substrate for vapor deposition, and having a magnetic metal layer provided on at least the peripheral portion of each opening of a surface of the resin film to be brought into contact with the substrate for vapor deposition, and is characterized in that the magnetic metal layer is formed by at least one method selected from sputtering method, ion plating method, laser ablation method, cluster ion beam method, aerosol deposition method, cold spray method, and chemical deposition method, after completing a formation of the openings in the resin film.

A vapor deposition method for vapor depositing a vapor deposition material according to the present invention is a method for placing a magnet, a substrate for vapor deposition, and a deposition mask one upon another, and then vapor depositing a vapor deposition material in a predetermined pattern on the substrate for vapor deposition from the deposition mask direction by causing the vapor deposition material to vaporize, and is characterized in that it is performed by using the deposition mask according to the present invention in a state where the substrate for vapor deposition and the deposition mask are in close contact with each other. Another vapor deposition method for vapor depositing a vapor deposition material according to the present invention is a method for placing an electromagnet, a substrate for vapor deposition, and a deposition mask having a magnetic metal layer as the permanent magnet according to the present invention one upon another and then vapor depositing a vapor deposition material in a predetermined pattern on the substrate for vapor deposition from the deposition mask direction by causing the vapor deposition material to vaporize, and is characterized in that separation of the electromagnet and the substrate for vapor deposition from the deposition mask is performed by causing the electromagnet to generate a magnetic field for repelling the deposition mask after completing the vapor deposition of the vapor deposition material.

A method for manufacturing an organic EL display apparatus according to the present invention is a method for manufacturing an organic EL display apparatus by depositing an organic layer on an apparatus substrate, and is characterized by positioning and overlapping the deposition mask according to the present invention on the apparatus substrate having at least a TFT and a first electrode formed on a support substrate, forming an organic deposition layer by vapor depositing an organic material on the first electrode, and forming a second electrode on the deposited layer.

Effects of the Invention

According to the deposition mask of the present invention, close contact between a substrate for vapor deposition and a resin film of the deposition mask can be enhanced at the peripheral portion of each opening in the resin film during vapor deposition. Therefore, the occurrences of film blurs and shadows during vapor deposition can be suppressed. As a result, a highly accurate vapor deposition film can be formed.

Further, according to the method for manufacturing a deposition mask of the present invention, after forming openings in a resin film constituting the deposition mask, a magnetic metal layer is formed on at least a peripheral portion of each opening of a surface of the resin film to be brought into contact with a substrate for vapor deposition by at least one method selected from sputtering method, ion plating method, laser ablation method, cluster ion beam method, aerosol deposition method, cold spray method, and chemical deposition method. Therefore, the magnetic metal layer can be formed so as to reach the periphery of each opening without affecting the opening accuracy, and sufficient magnetic force acts on the periphery of each opening during vapor deposition to enhance close contact with the substrate for vapor deposition. The deposition mask capable of suppressing the occurrence of film blurs or shadows during vapor deposition can be obtained.

Further, according to the vapor deposition method for depositing a vapor deposition material of the present invention, since high close contact between a substrate for vapor deposition and a deposition mask at a peripheral portion of each opening during vapor deposition can be achieved, the vapor deposition can be performed while suppressing the occurrences of film blurs and shadows. In addition, according to another vapor deposition method for depositing a vapor deposition material of the present invention, since a magnetic metal layer serves as a magnet, while achieving close contact between a substrate for vapor deposition and a deposition mask by stronger magnetic force, separation of the electromagnet and the substrate for vapor deposition from the deposition mask after completing the vapor deposition is performed by causing the electromagnet to generate a magnetic field for repelling the deposition mask. By doing so, it becomes possible to easily disengage the deposition mask without causing any deformation. The deposition mask can be used smoothly and continuously, and smooth progress of a manufacturing line can be secured.

Further, according to the method for manufacturing an organic EL display apparatus of the present invention, since an organic layer is deposited by using a deposition mask capable of suppressing the occurrences of film blurs and shadows during vapor deposition, the organic EL display apparatus capable of forming the organic layer of each pixel very precisely even for high precision pixel pattern and, as a result, very excellent in display quality can be obtained.

EMBODIMENT FOR CARRYING OUT THE INVENTION

Figure 1:
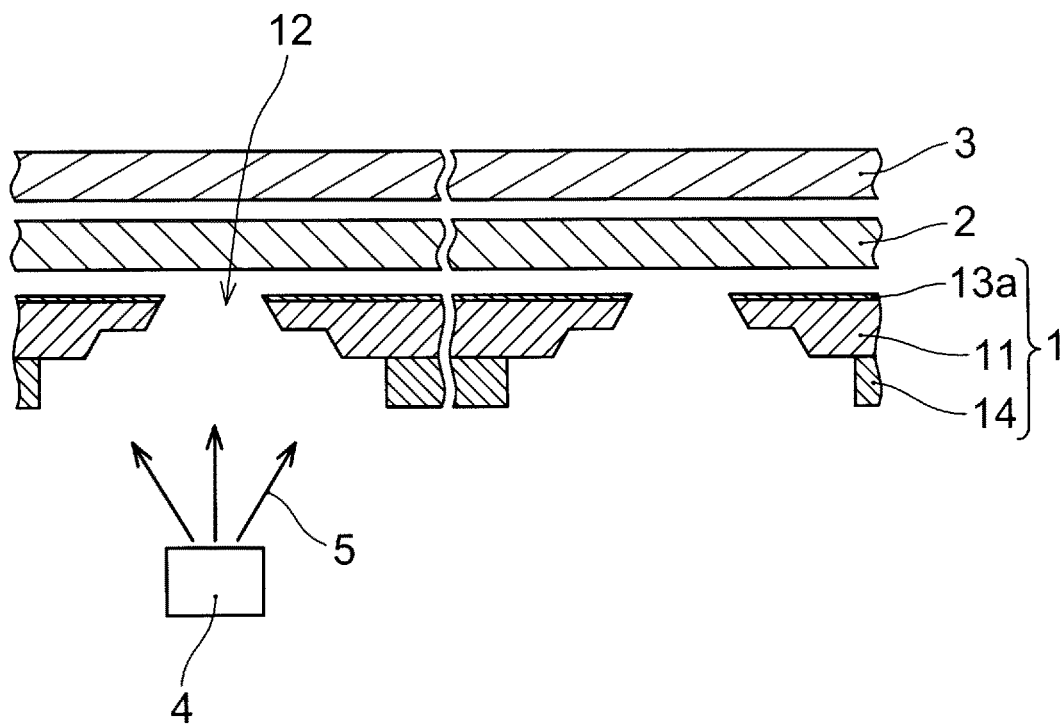
FIG. 1 is a view illustrating a cross section of an embodiment of a deposition mask according to the present invention together with a positional relationship in a usage state.
Figure 2:
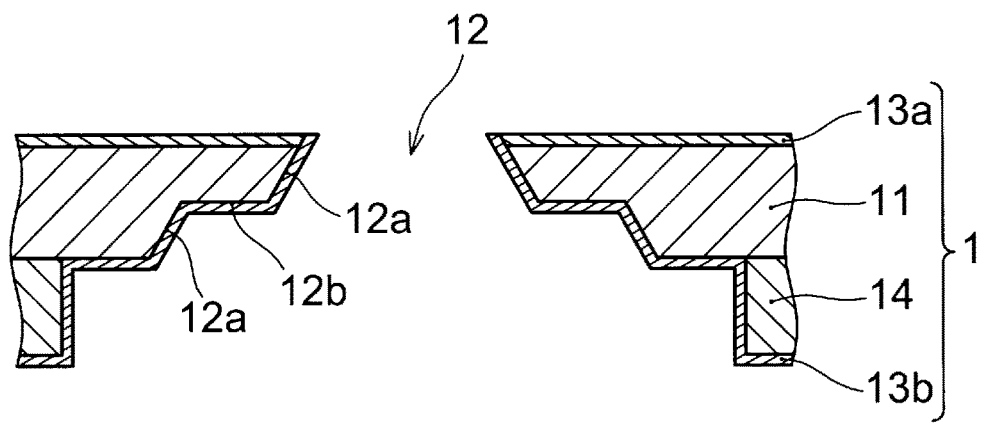
FIG. 2 is a view illustrating a cross section of another embodiment of a deposition mask according to the present invention.

A deposition mask and a method for manufacturing the same according to the present invention, and a vapor deposition method using the deposition mask according to the present invention, will be described with reference to the attached drawings. FIG. 1 is a view illustrating an embodiment of the deposition mask according to the present invention together with an arrangement relationship between a substrate for vapor deposition 2 and a magnet 3. FIG. 2 is an explanatory view of a partial cross section of another embodiment of the deposition mask according to the present invention. FIG. 1 illustrates two openings and surrounding regions thereof. FIG. 2 illustrates only one opening and a surrounding region thereof. Actually, for example, a deposition mask having a large number of openings matching the number of pixel of at least one organic EL display apparatus (including the number of sub-pixel of RGB) is formed, and in some case a plurality of them may be collectively formed.

Figure 4:
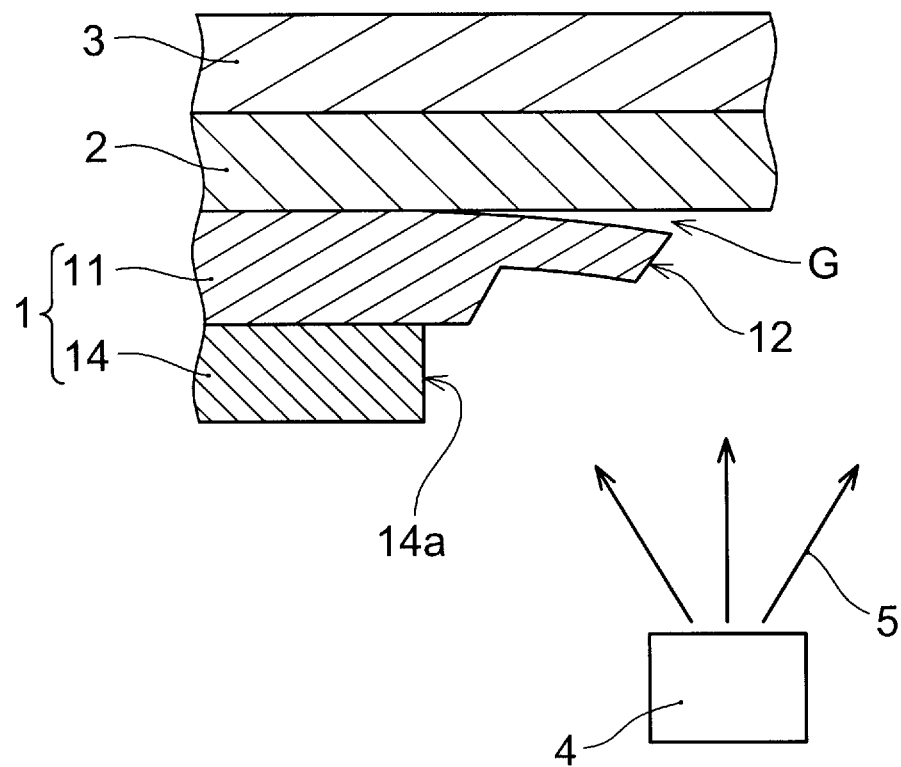
FIG. 4 is a view illustrating problems of a deposition mask according to a conventional technique.

A deposition mask 1 according to the present embodiment, as illustrated in FIG. 1, includes a magnetic metal layer 13a formed very thinly by sputtering so as to reach the edge of each opening 12 in the resin film 11 on the entire surface of the resin film 11 to be brought into contact with the substrate for vapor deposition 2. Thus, when the deposition mask 1 is attracted and fixed to the substrate for vapor deposition 2 by using the magnet 3, the magnetic chuck acts also on the peripheral portion of the each opening 12 in the deposition mask 1 and the deposition mask 1 can be brought into close contact with the substrate for vapor deposition 2. Therefore, it is possible to reduce the problem of accuracy deterioration due to film blurs and shadows when depositing the vapor deposition material 5. In the case when a metal support layer 14 described below is provided on a surface of the resin film 11 toward facing a vapor deposition source 4, the magnetic chuck acts substantially even when a region where the magnetic metal layer 13a is not provided is present partly on the surface of the resin film 11 to be brought into contact with the substrate for vapor deposition 2, which corresponds to a region where the metal support layer 14 is provided. However, since the vicinity of the opening 12 is a portion that tends to be particularly deformed as illustrated in FIG. 4 and the metal supporting layer 14 is not provided, the magnetic metal layer 13a is essentially required to be provided at least on the peripheral portion of each opening 12. On the other hand, even in the case where the metal support layer 14 is provided, it is preferable from the viewpoint of enhancing the attraction force of the magnet 3 that the magnetic metal layer 13a is provided on the entire surface closest to the magnet 3.

Further, as illustrated in FIG. 2, the deposition mask 1 according to another embodiment includes the magnetic metal layer 13a formed on at least the peripheral portion of each opening 12 of the surface of the resin film 11 to be brought into contact with the substrate for vapor deposition 2, and further a magnetic metal layer 13b is formed on at least the peripheral portion of each opening 12 of a surface of the resin film 11 facing the vapor deposition source 4. Even in this case, although it is particularly effective that the magnetic metal layer 13b is formed on the peripheral portion of the opening 12 where the metal support layer 14 is not provided, the magnetic metal layer 13b can be formed on the entire surface of the metal support layer 14 without causing any problem, and from the viewpoint of increasing the attraction force by the magnetic chuck, it is preferable to form the magnetic metal layer 13b on the entire surface.

As illustrated in FIGS. 1 and 2, in an embodiment of the present invention, a metal support layer 14 can be provided on a surface of the resin film 11 toward facing the vapor deposition source 4. Further, although not illustrated in FIGS. 1 and 2, in another embodiment, a close contact layer can be provided between the resin film 11 and the magnetic metal layer 13a or 13b. Provision of the metal support layer 14 intends to prevent warpage or the like of the resin film 11 and enhance the strength of the resin film 11. On the other hand, the close contact layer improves close contact between the resin film 11 and the magnetic metal layer 13a, 13b. In the case of providing the metal support layer 14, the metal support layer 14 can function as a magnetic layer if selection of its material is appropriate. In such a case, it is not particularly required to provide the second magnetic metal layer 13b on the surface of the metal support layer 14 facing the vapor deposition source 4. However, as mentioned above, the magnetic metal layer 13b can be formed on the surface including the metal support layer 14 in consideration of the effect of increasing the attraction force and manufacturing efficiency. Although the metal support layer 14 is formed in the examples illustrated in FIGS. 1 and 2, the present invention is particularly effective in the case of using only the resin film 11 not provided with the metal support layer 14. In this case, it is preferable to form the magnetic metal layers 13a and 13b entirely on both surfaces of the resin film 11, respectively.

Although not specifically limited, the resin film 11 preferably has a linear expansion coefficient that is not so different from that of the substrate for vapor deposition 2. For example, polyimide (PI) resin, polyethylene naphthalate (PEN) resin, polyethylene terephthalate (PET) resin, cycloolefin polymer (COP) resin, cyclic olefin copolymer (COC) resin, polycarbonate (PC) resin, polyamide resin, polyamide-imide resin, polyester resin, polyethylene resin, polyvinyl alcohol resin, polypropylene resin, polystyrene resin, polyacrylonitrile resin, ethylene-vinyl acetate copolymer resin, ethylene-vinyl alcohol copolymer resin, ethylene-methacrylic acid copolymer resin, polyvinyl chloride resin, polyvinylidene chloride resin, cellophane, ionomer resin are usable. Polyimide resin is preferable in adjustability of the linear expansion coefficient variable depending on conditions of a temperature ascent profile of the heat treatment in the case of forming a resin film by applying a precursor solution and performing heat treatment, but the resin film 11 is not limited thereto. The thickness of the resin film 11 is approximately several μm to several tens μm, for example, approximately 5 μm or more and 10 μm or less.

The magnetic metal layer 13a is preferably a ferromagnetic substance, and is preferably a film formed of Ni, Fe, Co, their alloys including invar, Mn—Al alloy, or an intermetallic compound such as $SmCo_5$ or $Sm_2Co_{17}$, $Nd_2Fe_{14}B$. The magnetic metal layer 13a can be a permanent magnet. For example, thin film permanent magnets, which have been developed recently by laminating crystals such as tetragonal intermetallic compounds of $R_2Fe_{14}B$ (R is a rare-earth element), can be formed by sputtering and used as the permanent magnet. Thus, fixing the substrate for vapor deposition 2 from the back surface (the surface opposite to the deposition mask 1) using the electromagnet 3 becomes possible. In the deposition mask 1 according to the present invention, since the magnetic metal layer 13a is provided at the peripheral portion of each opening 12 in the resin film 11 on the surface to be brought into contact with the substrate for vapor deposition 2, by attracting the substrate for vapor deposition 2 from the back surface by using the magnet 3 being a permanent magnet or an electromagnet during vapor deposition, high close contact between the substrate for vapor deposition 2 and the deposition mask 1 can be obtained. In particular, close contact at the peripheral portion of each opening 12 that has an influence on the vapor deposition pattern can be greatly improved. Therefore, film blurs and shadows during vapor deposition hardly occur. On the other hand, in the case where the magnetic metal layers 13a and 13b are permanent magnets, there is possibility to distort the resin film 11 when attracted by the magnet 3 due to its strong attractive force. In addition, when the deposition mask 1 is removed after completing the vapor deposition, easily removing the deposition mask 1 may be difficult. In such a case, by using an electromagnet as the magnet 3 to be disposed on the back surface of the substrate for vapor deposition 2, the magnetic field can be adjusted when positioning the deposition mask 1 relative to the substrate for vapor deposition 2 or separating the deposition mask 1 from the substrate for vapor deposition 2 after completing the vapor deposition. When forming permanent magnets on the magnetic metal layers 13a and 13b, since the direction of magnetization is constantly formed in a predetermined direction, even in the case of using a permanent magnet as the magnet 3, by using a permanent magnet having polarity for attraction, attracting is possible.

The thickness of the magnetic metal layer 13a is approximately 0.1 μm or more and 6 μm or less. If the thickness of the magnetic metal layer 13a is too thin, it is difficult for the magnetic metal layer 13a to function as a magnetic layer even when attracted by the magnet 3 and accordingly holding sufficient magnetic force is impossible. If the thickness of the magnetic metal layer 13a is too thick, the depth of the opening 12 in the mask becomes larger and shadows may be formed during vapor deposition and forming an accurate vapor deposition pattern may be impossible.

Further, the surface of the magnetic metal layer 13a is preferably a rough surface. Thus, the emissivity of the magnetic metal layer 13a can be increased and, by releasing the heat of the resin film 11 accumulated during vapor deposition to the outside as much as possible, the temperature rise of the deposition mask 1 can be suppressed. Regarding the degree of the rough surface, the surface roughness of the layer is preferably 0.1 μm or more and 3.0 μm or less in root-mean-square height, more preferably 0.3 μm or more. Further, in consideration of layer thickness, the surface roughness of the film is preferable 3.0 μm or less, more preferably 1.0 μm or less in root-mean-square height. The surface roughness of the layer varies depending on the method for forming the magnetic metal layer 13a. By employing an aerosol deposition method, a cold spray method, or the like for its formation, it is possible to easily obtain a rough surface. Further, it may be useful to perform a surface roughening treatment by argon-based sputter etching after completing the layer formation.

The material and the thickness of the magnetic metal layer 13b provided on the surface of the resin film 11 facing the vapor deposition source 4 are the same as those of the above-mentioned magnetic metal layer 13a provided on the surface to be brought into contact with the substrate for vapor deposition 2, and therefore their explanations are omitted. The magnetic metal layer 13b, when it is formed of the above-mentioned material, can be constituted as a low-emissivity layer whose emissivity is basically lower than that of the resin film 11. By forming the magnetic metal layer 13b as a low-emissivity layer whose emissivity is lower than that of the resin film 11 it is possible to suppress the temperature rise of the deposition mask 1 due to radiant heat from the vapor deposition source 4. Further, the surface of the magnetic metal layer 13b is preferably a mirror surface. Thus, the emissivity of the surface of the deposition mask 1 facing the vapor deposition source 4 can be further lowered, and the temperature rise of the deposition mask 1 due to radiant heat from the vapor deposition source 4 can be suppressed effectively.

In addition, for example, in the case of repeating the vapor deposition of an organic material by using the same deposition mask 1, since the organic material is deposited on the deposition mask 1, cleaning of the deposition mask 1 is usually performed at a certain period (deposition of approximately 1 μm). Organic solvents such as cyclohexanone, N-methylpyrrolidone (NMP), ethanol, isopropyl alcohol, acetone, monoethanolamine, dimethylsulfoxide and the like are generally used for cleaning the deposition mask 1. Therefore, the magnetic metal layers 13a and 13b are also required to have washability (solvent resistance) and durability. From the viewpoint of the foregoing, the magnetic metal layers 13a and 13b are made of the above-mentioned metal material and do not cause any particular problem.

For example, appropriate metal material such as iron, stainless, invar, nickel or the like, whose thickness is approximately 5 μm or more and 30 μm or less, can be used as the metal support layer 14. Magnetic substance is preferable in that the magnetic force is available when fixing to the substrate for vapor deposition 2 by the magnetic chuck. However, when the magnetic metal layer 13b is also provided on the metal support layer 14, the material of the metal support layer 14 is not particularly required to be a magnetic substance. Further, in consideration of less expansion when heated, using invar is more preferable.

As mentioned above, the close contact layer is preferably provided to improve close contact between the resin film 11 and the magnetic metal layer 13a or the magnetic metal layer 13b and to prevent peeling-off of the magnetic metal layers 13a and 13b so as to improve the durability, but the provision of the close contact layer is not essential. By providing the close contact layer it is possible to easily smoothen the surface of a film to be provided thereon. Therefore, it is more preferable to provide the close contact layer between the magnetic metal layer 13b and the resin film 11. On the other hand, in the case of providing the close contact layer between the magnetic metal layer 13a and the resin film 11, it is preferable to roughen the surface of the close contact layer by argon-based sputter etching or the like before forming the magnetic metal layer 13a, so as to provide irregularities. Employing the sputtering method or the like for forming the close contact layer is, in particular, advantageous to improve close contact with the resin film 11.

For example, Ti, Cr or Mo can be selected as the material of the close contact layer, and Ti is particularly preferable because of excellence in close contact.

The opening 12 is exaggeratedly illustrated as having a taper shape in FIG. 1 and the following figures. The reason why the opening 12 is formed in taper shape is that since the vapor deposition material 5 is emitted from the vapor deposition source 4 as a fan-shaped vapor deposition beam having, in a cross-sectional shape, a predetermined angle determined by the shape of a crucible of the vapor deposition source 4, it is required to enable vapor deposition particles in the side end region of the beam to reach a desired place on the substrate for vapor deposition 2 without being blocked. In any of the illustrated examples, the opening 12 in the resin film 11 is formed to have two stepped portions to ensure the effect of avoiding the above-mentioned blocking. The formation of these two stepped portions can be realized by performing laser irradiation for opening the resin film 11 with two types of laser masks alternately replaceable as laser masks and having different opening sizes. Further, the taper shape can be obtained by differentiating the transmittance of a laser beam between a central region and a peripheral region of each opening in the laser mask. If necessary, the metal support layer 14 can be configured to have the tapered openings from the similar reason.

Next, a method for manufacturing the deposition mask 1 according to the present invention will be described with reference to FIG. 2. The method for manufacturing the resin film 11, the method for manufacturing a laminate comprising the metal support layer 14 having openings and the resin film 11 in the case of manufacturing the so-called hybrid type deposition mask 1 comprising the metal support layer 14, and the method for forming the opening 12 can be carried out by using conventionally known various methods. Therefore, the method for manufacturing the deposition mask 1 according to the present invention is mainly described with respect to formation processes of the magnetic metal layers 13a and 13b.

First, for example, the resin film 11 is (stretched and) fixed to a support frame (not shown) by applying a tension in four directions thereof. In this case, the metal support layer 14 may be provided beforehand on the resin film 11 to be fixed. The stretching of the resin film 11 intends to eliminate any slack of the resin film 11, because the slack makes the size of the formed opening 12 inaccurate and the vapor deposition process possibly ends with less accuracy. The support frame (frame body) is required to have a sufficient rigidity capable of withstanding, for example, a tension applied. A metal plate whose thickness is 5 nm or more and 50 mm or less can be used. In the case of providing the metal support layer 14, the support frame is fixed in a stretched state to the metal support layer 14 by laser welding or the like. In the case of omitting the metal support layer 14, the support frame can be adhered directly to the resin film 11 with an adhesive or the like. In this case, an adhesive generating no gas during the vapor deposition can be used. For example, it is preferable to use a completely curable adhesive such as an epoxy resin adhesive as the adhesive. If the support frame is a metal plate with magnetization, handling in the fixation to the substrate for vapor deposition 2 by using the magnet becomes easy, even when the metal support layer 14 is not presented and when the magnetic metal layer is not provided on the entire surface of the deposition mask. A conventionally known method is employable for stretching the resin film 11.

Next, a pattern of openings 12 is formed on the resin film 11. The formation of the opening in the resin film 11 can be performed by an ordinary method in the field of manufacturing the deposition mask 1. For example, the resin film 11 fixed to the support frame is fixed to a working stage, and the resin film 11 is irradiated with a laser beam to form the opening 12 by using a laser mask manufactured for the patterning of the opening 12. In this case, as mentioned above, the opening 12 in the resin film 11 can be formed to have two stepped portions. In addition, the opening 12 can be formed into a taper shape.

Next, the deposition mask 1 according to the present invention can be obtained by forming the magnetic metal layer 13a. The timing to form the magnetic metal layer 13a is not limited specifically. For example, even when the formation of the magnetic metal layer 13a precedes the provision of the opening in the resin film 11, if the thickness of the magnetic metal layer 13a is appropriate, it is possible to simultaneously provide the openings 12 by patterning the magnetic metal layer 13a together with the resin film 11. Needless to say, the magnetic metal layer 13a can also be formed after providing the openings in the resin film 11. In consideration of the influence by cracks or the like due to fixing to the support frame, it is preferable to form the magnetic metal layer 13a after stretching and fixing the resin film 11 constituting the deposition mask 1 to the support frame. Further, in consideration of patterning accuracy of openings 12 to be formed in the resin film 11, it is preferable to form the magnetic metal layer 13a after providing openings in the resin film 11.

The method for forming the magnetic metal layer 13a is not limited specifically, and any method employable in this case is selectable from sputtering method, ion plating method, laser ablation method, cluster ion beam method, aerosol deposition method, cold spray method, and chemical deposition method. From the viewpoint of close contact, selecting the sputtering method is preferable. From the viewpoint of surface roughness, selecting the aerosol deposition method or the cold spray method is preferable. To satisfy both requirements, as mentioned above, it is preferable to form a close contact layer (not shown) by the sputtering method and subsequently form the magnetic metal layer 13a by the aerosol deposition method or the cold spray method. In addition, when the magnetic metal layer 13a is a permanent magnet, it can be performed by obtaining a specific crystal structure by a sputtering method using a metallographic structure control technology.

In addition, when the magnetic metal layer 13b is provided on the surface of the resin film 11 toward facing the vapor deposition source 4, the timing to form the magnetic metal layer 13b is not limited specifically. For example, even when the formation of the magnetic metal layer 13b precedes the provision of openings in the resin film 11, similar to the above-mentioned magnetic metal layer 13a, if the thickness of the magnetic metal layer 13b is appropriate, it is possible to simultaneously provide openings 12 by patterning the magnetic metal layer 13b together with the resin film 11. On the other hand, the formation of the magnetic metal layer 13b preferably follows after the provision of openings 12 in the resin film 11. This is because the state after forming openings 12 is advantageous in forming the magnetic metal layer 13b on a side surface (inclined surface) 12a of the taper-shaped openings 12 in the resin film 11 and, even when the openings 12 having a stepped portion is present in the resin film 11 as illustrated in FIG. 2, on a surface 12b of the stepped portion facing the vapor deposition source.

The method for forming the magnetic metal layer 13b is not limited specifically, a method employable in this case is selectable from sputtering method, ion plating method, laser ablation method, cluster ion beam method, aerosol deposition method, cold spray method, and chemical deposition method. From the viewpoint of close contact or from the viewpoint of surface roughness, selecting the sputtering method is preferable.

Next, a vapor deposition method according to the present invention will be described. The method for manufacturing the deposition mask 1 is as described above, and in one embodiment the method for manufacturing the deposition mask 1 can be carried out by a conventionally known method except for using the deposition mask according to the present invention. Therefore, a special explanation thereof is omitted. In an alternative embodiment, it can be carried out by a conventionally known method, except for fixing and separation between the deposition mask 1 and the substrate for vapor deposition. Therefore, the fixing and separation between the deposition mask 1 and the substrate for vapor deposition 2 using the deposition mask 1 in this alternative embodiment will be mainly described with reference to FIG. 1.

In this alternative embodiment, the vapor deposition method according to the present invention is carried out by using the deposition mask 1 according to the present invention in which the magnetic metal layer 13a is a permanent magnet. In this case, it is preferable to use an electromagnet as the magnet 3 for fixing the deposition mask 1 to the substrate for vapor deposition 2. First, the deposition mask 1 and the substrate for vapor deposition 2 are overlapped with each other and positioned so that their alignment marks coincide with each other. Then, the magnet 3 is overlapped so as to attract the deposition mask 1 while interposing the substrate for vapor deposition 2 therebetween. During this alignment, it can be useful to adjust the strength of the electromagnet 3 so that the substrate for vapor deposition 2 and the deposition mask 1 are not brought into close contact with each other unnecessarily.

At the time of vapor deposition, the electromagnet 3 can be adjusted so as to generate a magnetic field sufficient for mutual attraction. If the magnetic force of the magnetic metal layer 13a is sufficient for attraction, it will be unnecessary to activate the electromagnet 3. The vapor deposition is performed in a state where the substrate for vapor deposition 2 and the deposition mask 1 are in close contact with each other. By causing the electromagnet 3 to generate a magnetic field for repelling the deposition mask 1 after completing the vapor deposition, the substrate for vapor deposition 2 can be separated from the deposition mask 1. By doing so, it becomes possible to easily separate the deposition mask 1. The deposition mask 1 can be used smoothly and continuously, and smooth progress of a manufacturing line can be secured.

Next, a method for manufacturing an organic EL display apparatus by using the deposition mask 1 according to the present invention will be described. The manufacturing method other than the deposition mask 1 and the vapor deposition method using the deposition mask can be carried out by a conventionally known method. Therefore, a method for depositing an organic layer using the deposition mask 1 is mainly described with reference to FIGS. 3A and 3B.

The method for manufacturing an organic EL display apparatus according to the present invention includes positioning and overlapping the deposition mask 1 manufactured by the above-mentioned method on an apparatus substrate 21 having TFTs (not shown), a flattening layer, and a first electrode (e.g., anode) 22 formed on a support substrate (not shown), forming an organic deposition layer 24 by vapor depositing an organic material 5a, and forming a second electrode 25 (cathode) on the deposition layer 24. It is described in more detailed by specific examples.

Figure 3A:
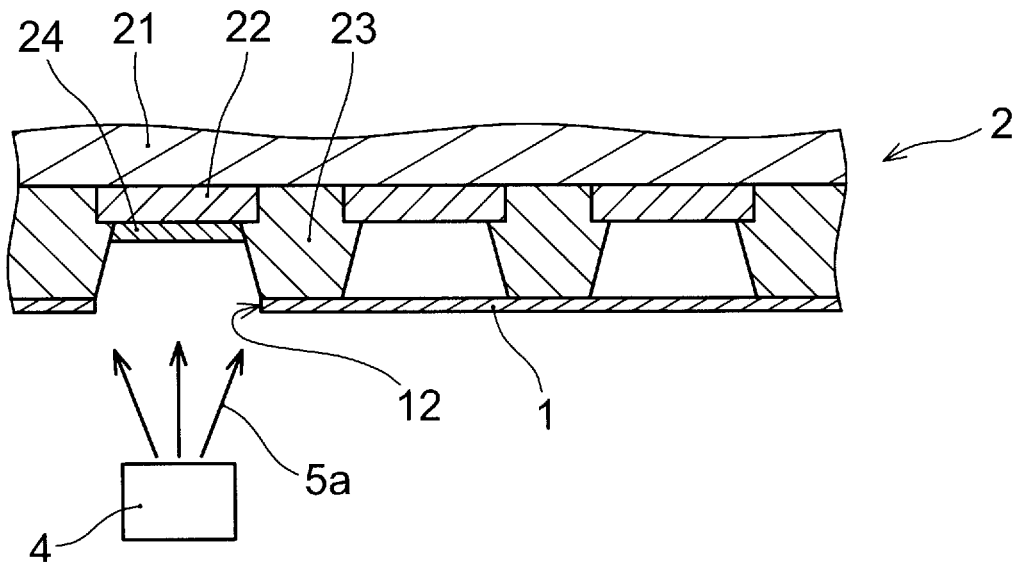
FIG. 3A is an explanatory view at the time of vapor deposition in the case of manufacturing an organic EL display apparatus according to the present invention.
Figure 3B:
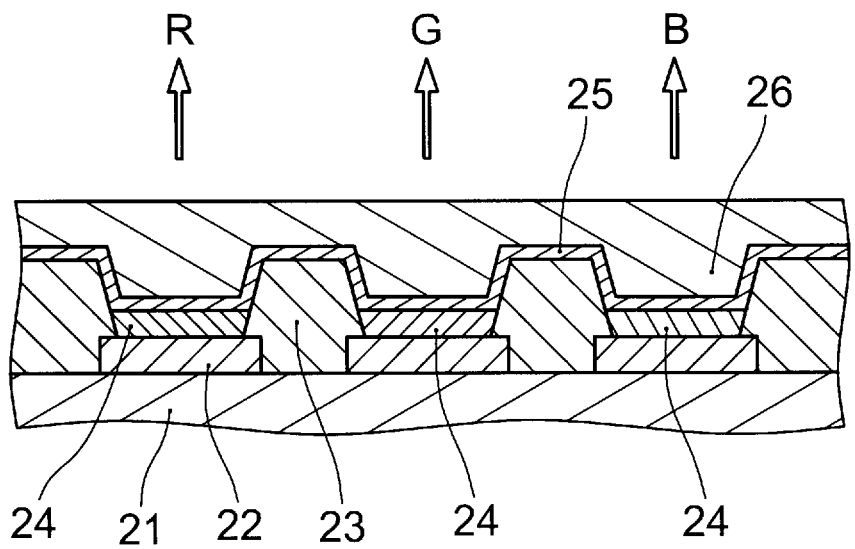
FIG. 3B is an explanatory view of a cross section illustrating a manufacturing process of an embodiment of a method for manufacturing an organic EL display apparatus according to the present invention.

Although not illustrated in the drawing, for example, the apparatus substrate 21 includes switching elements such as TFT formed on a support substrate such as a glass plate, a resin film or the like for respective RGB sub pixels of each pixel. The first electrode 22 connected to the switching element is formed as a combination layer of a metal layer (Al, APC or the like) and an ITO layer on the flattening layer. As illustrated in FIGS. 3A and 3B, an insulating bank 23 made of $SiO_2$, acrylic resin, polyimide resin or the like for separating between the adjacent sub pixels is formed. The above-mentioned deposition mask 1 is positioned and fixed on the insulating bank 23 of the apparatus substrate 21. The fixing in this case can be realized, for example, by attraction using a magnet or the like arranged at the apparatus substrate 21 opposite to the deposition mask 1. As mentioned above, when the magnetic metal layer 13a of the deposition mask 1 is a permanent magnet, it is preferable to use an electromagnet as the magnet 3 for attracting the deposition mask 1. In this case, as mentioned above, it can be useful to cause the electromagnet to generate a magnetic field for attracting the deposition mask 1 after positioning the deposition mask 1, or it can be useful to set the current of the electromagnet to 0 in some cases.

In this state, as illustrated in FIG. 3A, the organic material 5a is emitted from the vapor deposition material source (crucible) 4 within a vapor deposition apparatus, the organic material 5a is vapor deposited only at a portion corresponding to the openings 12 in the deposition mask 1, and the organic deposition layer 24 is formed on the first electrode 22 of a desired sub pixel. This vapor deposition process is performed for each sub pixel by sequentially changing the deposition mask. In some cases, the deposition mask may be used for vapor depositing the same material simultaneously for a plurality of sub pixels.

Although the organic deposition layer 24 is simply illustrated as a single layer in FIGS. 3A and 3B, the organic deposition layer 24 actually formed has a multilayered structure constituted by a plurality of layers made of different materials. For example, as a layer in contact with an anode 22, a hole injection layer made of a material excellent in consistency of ionization energy for improving hole injection property may be provided. A hole transport layer, which is made of, for example, amine-based material and capable of improving the stability in transporting holes and serving as an energy barrier confining electrons in the light-emitting layer, is formed on the hole injection layer. In addition, a light-emitting layer to be selected according to the light-emission wavelength is formed on this layer, for example, by doping red or green organic fluorescent material into $Alq_3$ for red or green color. As a material for blue color, a DSA-based organic material 5a is usable. In addition, an electron transport layer made of $Alq_3$ or the like, which is capable of improving electron injection property and stably transporting electrons, is formed on the light-emitting layer. Successively deposing these layers each having a thickness of approximately several tens nm can form the organic deposition layer 24. Optionally, an electron injection layer made of LiF, Liq or the like, which is capable of improving electron injection property, may be provided between the organic layer and the metal electrode.

In the organic deposition layer 24, an organic layer of the material corresponding to each of RGB colors is deposited to constitute a light-emitting layer. When emphasis is placed on light-emitting performance, it is preferable to separately deposit a material suitable for the light-emitting layer to constitute a hole transport layer and an electron transport layer. However, in consideration of material costs, the same material may be deposited commonly for two or three of RGB colors in some cases. In the case of depositing the common material for sub pixels of two colors or more, the deposition mask 1 having the openings corresponding to the common sub pixels is used. In the case where vapor deposition layers of respective sub pixels are different from each other, for example, it is feasible to use one deposition mask 1 for the R sub pixel and continuously deposit respective organic layers. In the case of depositing the organic layer common to RGB, it is feasible to deposit the organic layer of each sub pixel beneath the common layer and then deposit the organic layer common to all pixels at a time by using the deposition mask having openings common to RGB.

Upon completing the formation of all of the organic deposition layer 24 and the electron injection layer, such as LiF layer, the deposition mask 1 is removed and the second electrode (e.g., cathode) 25 is formed on the entire surface. The example illustrated in FIG. 3B is a top emission type configured to emit light from the upper direction. Therefore, the second electrode 25 is formed of a translucent material, for example, a thin Mg—Ag eutectic layer. In addition, Al thin layer or the like can be used. In the case of a bottom emission type configured to emit light from the apparatus substrate 21 direction, the first electrode 22 can be made of ITO, $In_3O_4$ or the like and the second electrode 25 can be made of a metal whose work function is small, such as Mg, K, Li, Al or the like. A protective layer 26 made of, for example, $Si_3N_4$ or the like is formed on the surface of the second electrode 25. Although not illustrated, a sealing layer made of glass or a resin film is provided to seal the whole so as to prevent the organic deposition layer 24 from absorbing moisture. Further, another employable structure includes the organic layer as common as possible and color filters provided on its surface.

In the vapor deposition method or the method for manufacturing an organic EL display apparatus according to the present invention, the deposition mask 1 can be repetitively used. Since the organic material 5a is deposited on the surface of the deposition mask 1 facing the vapor deposition source 4, in the case of using the same deposition mask 1 to repetitively perform vapor deposition of the organic material 5a, in order to prevent the accumulated layer from falling off the mask and becoming particles, it is preferable to perform cleaning at the timing when the thickness of the accumulative deposited layer is approximately 1.0 μm or more and 3.0 μm or less. The cleaning of the deposition mask 1 can be performed by an ordinary method, for example by using an organic solvent, as mentioned above.

REFERENCE SIGNS LIST

1 Deposition mask
11 Resin film
12 Opening
12a Side surface of opening 12
12b Surface of stepped portion of opening 12 facing vapor deposition source
13a Magnetic metal layer provided on surface in contact with substrate for vapor deposition
13b Magnetic metal layer provided on surface of resin film facing vapor deposition source
14 Metal support layer
14a Opening
2 Substrate for vapor deposition
3 Magnet
4 Vapor deposition source
5 Vapor deposition material
5a Organic material
21 Apparatus substrate
22 First electrode
23 Bank
24 Organic deposition layer
25 Second electrode
26 Protective layer

The invention claimed is:

1. A deposition mask comprising:
a resin film defining openings, each of the openings extending through the resin film;
the resin film having a surface facing a substrate for vapor deposition and a surface facing vapor deposition source, the surface facing the substrate for vapor deposition and the surface facing vapor deposition source being opposite to each other;
wherein a first magnetic metal layer is on the surface of the resin film facing the substrate for vapor deposition to be brought into contact with the substrate for vapor deposition;
wherein each of the openings in the resin film have two stepped portions.

2. The deposition mask according to claim 1, wherein a second magnetic metal layer is on the surface of the resin film facing the vapor deposition source.

3. The deposition mask according to claim 1, wherein the first magnetic metal layer has a thickness of 0.1 μm or more and 6 μm or less.

4. The deposition mask according to claim 1, wherein the first magnetic metal layer is a layer whose emissivity is higher than an emissivity of the resin film.

5. The deposition mask according to claim 2, wherein the second magnetic metal layer is a film whose emissivity is lower than an emissivity of the resin film.

6. The deposition mask according to claim 1, wherein the first magnetic metal layer is a permanent magnet.

7. The deposition mask according to claim 1, wherein the first magnetic metal layer is a layer formed of at least one of a metal, an alloy, or an intermetallic compound selected from Ni, Fe, Co, invar, Mn—Al, $SmCo_5$ or $Sm_2Co_{17}$.

8. The deposition mask according to claim 1, wherein a metal support layer is provided on a portion of the surface of the resin film facing the vapor deposition source.

9. A method for manufacturing a deposition mask comprising a resin film having openings and usable in vapor depositing a vapor deposition material on a substrate for vapor deposition, and having a magnetic metal layer on a surface of the resin film facing the substrate for vapor deposition, wherein each of the openings in the resin film have two stepped portions;

which comprises forming the magnetic metal layer by at least one method selected from sputtering method, ion plating method, laser ablation method, cluster ion beam method, aerosol deposition method, cold spray method, and chemical deposition method, after completing a formation of the openings in the resin film.

10. A vapor deposition method for placing a magnet, a substrate for vapor deposition, and a deposition mask, and vapor depositing a vapor deposition material in a predetermined pattern on the substrate for vapor deposition from the deposition mask direction by causing the vapor deposition material to vaporize, which comprises vapor depositing the vapor deposition material by using the deposition mask according to claim 1 as the deposition mask in a state where the substrate for vapor deposition and the deposition mask are in close contact with each other.

11. A vapor deposition method for placing an electromagnet, a substrate for vapor deposition, and a deposition mask, the deposition mask comprising a resin film having a pattern of openings for forming a thin layer pattern by vapor deposition on a substrate for vapor deposition, and a magnetic metal layer on at least a peripheral region of each of said openings of a surface of said resin film to be brought into contact with said substrate for vapor deposition;

wherein said magnetic metal layer provided on said surface of said resin film to be brought into contact with said substrate for vapor deposition is a permanent magnet;

and vapor depositing a vapor deposition material in a predetermined pattern on said substrate for vapor deposition from said deposition mask direction by causing the vapor deposition material to vaporize, which comprises performing separation of said electromagnet and said substrate for vapor deposition from said deposition mask by causing said electromagnet to generate a magnetic field for repelling said deposition mask, after completing vapor deposition of said vapor deposition material.

12. A method for manufacturing an organic EL display apparatus by depositing an organic layer on an apparatus substrate, the method comprising:

positioning and overlapping the deposition mask according to claim 1 on the apparatus substrate having at least a TFT and a first electrode formed on a support substrate;

forming an organic deposition layer by vapor depositing an organic material on the first electrode, and forming a second electrode on the deposition layer.

* * * * *